(12) United States Patent
Myers et al.

(10) Patent No.: US 6,853,556 B1
(45) Date of Patent: Feb. 8, 2005

(54) METHODS AND APPARATUS FOR DECOUPLING CIRCUIT BOARD CONNECTORS

(75) Inventors: Gary Lynn Myers, San Ramon, CA (US); Jack Brown Rector, III, Palo Alto, CA (US); Michael Chern, San Jose, CA (US)

(73) Assignee: Cisco Techonology, Inc., San Jose, CA (US)

( * ) Notice: Subject to any disclaimer, the term of this patent is extended or adjusted under 35 U.S.C. 154(b) by 0 days.

(21) Appl. No.: 10/755,572

(22) Filed: Jan. 12, 2004

(51) Int. Cl.[7] ............................. H05K 5/00; H05K 5/04; H05K 5/06
(52) U.S. Cl. ....................................... 361/754; 361/747
(58) Field of Search ................................. 361/683–686, 361/728, 732, 735, 736, 740, 741, 742, 747, 748, 752, 754, 755, 756, 758, 759, 801, 802

(56) References Cited

U.S. PATENT DOCUMENTS 5,973,924 A * 10/1999 Gillespie, Jr. ............... 361/735

* cited by examiner

Primary Examiner—Phuong T. Vu
(74) Attorney, Agent, or Firm—David E. Huang, Esq.; Jeffrey J. Duquette, Esq.

(57) ABSTRACT

A motherboard assembly includes a motherboard, a circuit board, and an ejector assembly. The motherboard has a motherboard connector extending from a planar surface of the motherboard. The circuit board has a circuit board connector extending from a planar surface of the circuit board and coupled to the motherboard connector of the motherboard such that the planar surface of the circuit board orients substantially parallel to the planar surface of the motherboard. The ejector assembly orients between the motherboard and the circuit board. During an ejection procedure, the ejector assembly separates the motherboard connector and the circuit board connector while minimizing bending of either the circuit board or the motherboard. By limiting bending of either the circuit board or the motherboard, the ejector assembly minimizes damage to electrical traces or components carried by either the circuit board or the motherboard during the separation process.

37 Claims, 7 Drawing Sheets

METHODS AND APPARATUS FOR DECOUPLING CIRCUIT BOARD CONNECTORS

BACKGROUND

A typical circuit board assembly includes a circuit board formed of circuit board materials (e.g., fiberglass, copper, etc.) and circuit board components (e.g., processor, memory, etc.) mounted to the circuit board. To improve the performance of certain circuit board assemblies (e.g., to expand memory or expand processing capability of the circuit board assembly), manufacturers electrically interconnect one or more separate circuit board assemblies. For example, manufacturers attach secondary computer board assemblies, referred to as daughter boards, to a primary circuit board, referred to as a motherboard. Such attachment typically occurs between a daughter board connector associated with the daughter board and a motherboard connector associated with the motherboard. Electrical coupling of the daughter board connector to the motherboard connector allows for transfer of data, power, and ground signals between the daughter board and the motherboard.

In one typical circuit board configuration, the motherboard connector is configured as a receptacle that includes a number of electrical contact portions disposed within the receptacle. Also in the typical circuit board configuration, the daughter board defines an edge having several contact pads corresponding to the contact portions disposed within the receptacle. During assembly, a manufacturer inserts the edge of the daughter board having the contact pads within the receptacle of the motherboard. Such insertion forms an electrical connection between the contact portions disposed within the receptacle and the contact pads of the daughter board and provides for electrical communication between the motherboard and the daughter board. In such an arrangement, after assembly, a planar surface of the daughter board orients substantially perpendicular to a planar surface of the motherboard.

In another typical circuit board configuration, a motherboard has a motherboard connector coupled to a planar surface of the motherboard and a daughter board has a daughter board connector coupled to a planar surface of the daughter board. In one arrangement, the daughter board connector has multiple pins (e.g., the daughter board connector has a pin density of approximately 400 to 500 pins) and the corresponding motherboard connector has multiple sockets corresponding to the pins of the daughter board connector. Based on such a configuration, a manufacturer couples the daughter board to the motherboard in mezzanine or parallel-board arrangement. During assemblies, the manufacturer aligns the daughter board connector with the motherboard connector and presses the daughter board against the motherboard to mate the corresponding connectors.

SUMMARY

As described above, in one typical circuit board configuration the motherboard connector is configured as a receptacle that includes a number of electrical contact portions and the daughter board defines an edge having several contact pads corresponding to the contact portions disposed within the receptacle. In such a configuration, after connection of the contact pads of the daughter board with the receptacle of the motherboard, a planar surface of the daughter board orients substantially perpendicular to a planar surface of the motherboard.

In order to allow reworking or upgrading of either the daughter board or the motherboard, the daughter boards typically include a daughter board ejector. During an ejection process, the daughter board ejector generates a load between the perpendicularly oriented daughter board and motherboard. Because of the relatively small number of electrical contacts between the daughter board and the motherboard the ejector generates a relatively small amount of force or load between the daughter board and the motherboard.

Also as described above, in another typical circuit board configuration, a motherboard has a motherboard connector coupled to a planar surface of the motherboard and a daughter board has a daughter board connector coupled to a planar surface of the daughter board. In such a configuration, the daughter board couples to the motherboard in mezzanine or parallel-board arrangement. In one arrangement, the daughter board connector has multiple pins (e.g., the daughter board has a pin density of approximately 400 to 500 pins per board) and the corresponding motherboard connector has multiple sockets corresponding to the pins of the daughter board connector.

In order to allow reworking or upgrading of either the daughter board or the motherboard, to disassemble the daughter board from the motherboard, the manufacturer typically separates the daughter board from the motherboard (e.g., separates the daughter board connector from the motherboard connector) through a manual process. The manufacturer manually grasps two opposing edges of the daughter board and "rocks" the daughter board, relative to the motherboard, from a first edge to a second opposing edge. Such rocking creates an extraction force between the daughter board connector and the motherboard connector. For a daughter board having a pin density of approximately 400 to 500 pins per board, the extraction force required to separate the daughter board connector from the motherboard connector is typically between approximately 30 pound and 40 pounds force. Such extraction force overcomes a frictional force that secures the daughter board connector to the motherboard connector.

As the pin densities between the daughter board and the motherboard increase (e.g., up to 1000 pins per board), conventional techniques for separating daughter board connectors and motherboard connectors suffer from a variety of deficiencies.

In one example, assume the case where the daughter board couples to the motherboard such that a planar surface of the daughter board orients substantially perpendicular to a planar surface of the motherboard. An increase in the number of electrical contact portions of the motherboard connector, along with a corresponding increase in the number of contact pads of daughter board, increases the amount of force that the daughter board ejector must generate to separate the daughter board connector from the motherboard connector. In such a configuration, the increased amount of force generated by the daughter board ejector can exceed the material strength of either the daughter board or the motherboard (e.g., can exceed the material strength of the portions of the daughter board or the motherboard in communication with the daughter board ejector). Use of the ejector, in such an arrangement can, therefore, damage either the daughter board or the motherboard and, in turn, lead to the inoperability of either, or both, the daughter board or the motherboard.

In another example, assume the case where the daughter board is configured to couple to a motherboard in mezzanine or parallel-board arrangement. An increase in the contact density (e.g., pin density of the daughter board and socket density of the motherboard) from between 400–500 contacts per board to approximately 1000 contacts per board increases the amount of force required to separate the daughter board from the motherboard. For example, a daughter board and a motherboard having approximately 1000 contacts requires application of an extraction force of above approximately 100 pounds force between the daughter board and the motherboard.

In such a configuration, manual separation of the daughter board from the motherboard can be difficult for a person of average strength. Furthermore, manual separation of the daughter board from the motherboard allows a user to apply the manual extraction force to one or more edges of the daughter board thereby generating a moment on the edge of the circuit board relative to the daughter board connector and motherboard connector. Such a moment causes bending of the daughter board that, in turn, can potentially damage electrical traces or components carried by the daughter board.

By contrast, embodiments of the present invention significantly overcome the described deficiencies and provide mechanisms for separating a daughter board, or circuit board, from a motherboard. A motherboard assembly includes a motherboard, a circuit board, and an ejector assembly. The motherboard has a motherboard connector extending from a planar surface of the motherboard. The circuit board has a circuit board connector extending from a planar surface of the circuit board and coupled to the motherboard connector of the motherboard such that the planar surface of the circuit board orients substantially parallel to the planar surface of the motherboard. The ejector assembly orients between the motherboard and the circuit board. During an ejection procedure, the ejector assembly separates the motherboard connector and the circuit board connector while minimizing bending of either the circuit board or the motherboard. By limiting bending of either the circuit board or the motherboard, the ejector assembly minimizes damage to electrical traces or components carried by either the circuit board or the motherboard during the separation process.

In one arrangement, an ejector assembly has a housing, a lever support coupled to the housing, and a lever rotatably coupled to the lever support. The lever is configured to rotate about the lever support, relative to the housing and in response to an actuation force, to disengage a circuit board connector, extending from a planar surface defined by a circuit board, from a motherboard connector, extending from a planar surface defined by a motherboard, when circuit board connector couples to the motherboard connector and when the planar surface of the circuit board orients substantially parallel to the planar surface of the motherboard. The use of the ejector assembly minimizes bending of either the circuit board or the motherboard during separation of the motherboard connector and the circuit board connector and, therefore, minimizes damage to the electrical traces or components carried by the boards during the separation process.

In one arrangement, the lever of the ejector assembly has a distal end configured to rotatably couple to the lever support, a proximal end configured to allow actuation of the lever about the lever support, and a bearing contact surface disposed between the distal end of the lever and the proximal end of the lever. The bearing contact surface configured to slidably contact a bearing to allow disengagement the at least one circuit board connector from the at least one motherboard connector. Such a configuration of the bearing contact surface allows for a substantially uniform motion of the circuit board connector relative to the motherboard connector during separation of the circuit board connector from the motherboard connector, thereby minimizing damage to either connector (e.g., such as potentially caused by a non-uniform or jerking motion).

In one arrangement, the lever has a gasket configured to contact the planar surface defined by the circuit board. The gasket minimizes the presence of an air gap or space between the lever and the circuit board and, therefore, maintains contact between the lever and the circuit board to limit "rattling" or motion of the lever against the circuit board during movement of the circuit board assembly. In one arrangement, the gasket is formed of an electrically conductive material and electrically couple with a ground plane of the circuit board. Such coupling aids in shielding the circuit board from electromagnetic interference radiation received by the ejector assembly.

In one arrangement, the ejector assembly includes a fastener configured to couple the ejector assembly to the first circuit board where the fastener and the lever of the ejector assembly have a common visual grouping characteristic distinct from a visual characteristic of a motherboard mounting fastener associated with the circuit board. The common visual grouping characteristic allows a user to distinguish or differentiate the fasteners that couple the ejector assembly to the circuit board from the motherboard mounting fastener that couple the circuit board to a motherboard. Such differentiation allows the user to remove the motherboard mounting fasteners coupling the circuit board to the motherboard to decouple the circuit board from the motherboard rather than inadvertently removing the fasteners that secure the ejector assembly to the circuit board and detaching the ejector assembly from the circuit board.

The features of the invention, as described above, may be employed in systems, devices and methods for distributing an air stream to a circuit board as well as other computer-related components such as those of Cisco Systems of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms for separating a daughter board, or circuit board, from a motherboard. A motherboard assembly includes a motherboard, a circuit board, and an ejector assembly. The motherboard has a motherboard connector extending from a planar surface of the motherboard. The circuit board has a circuit board connector extending from a planar surface of the circuit board and coupled to the motherboard connector of the motherboard such that the planar surface of the circuit board orients substantially parallel to the planar surface of the motherboard. The ejector assembly orients between the motherboard and the circuit board. During an ejection procedure, the ejector assembly separates the motherboard connector and the circuit board connector while minimizing bending of either the circuit board or the motherboard. By limiting bending of either the circuit board or the motherboard, the ejector assembly minimizes damage to electrical traces or components carried by either the circuit board or the motherboard during the separation process.

Figure 1:
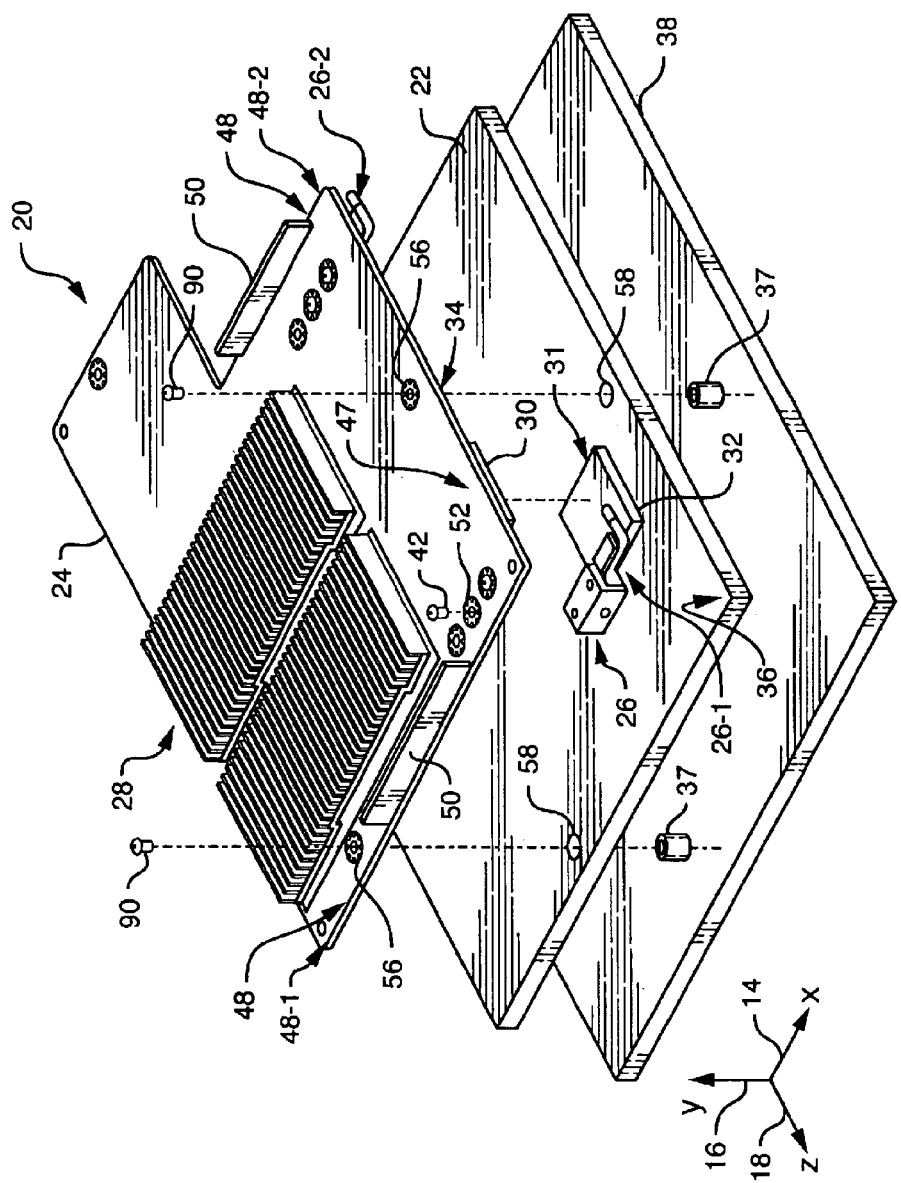
FIG. 1 illustrates an exploded, perspective view of a motherboard assembly using an ejector assembly, according to one embodiment of the invention.
Figure 2:
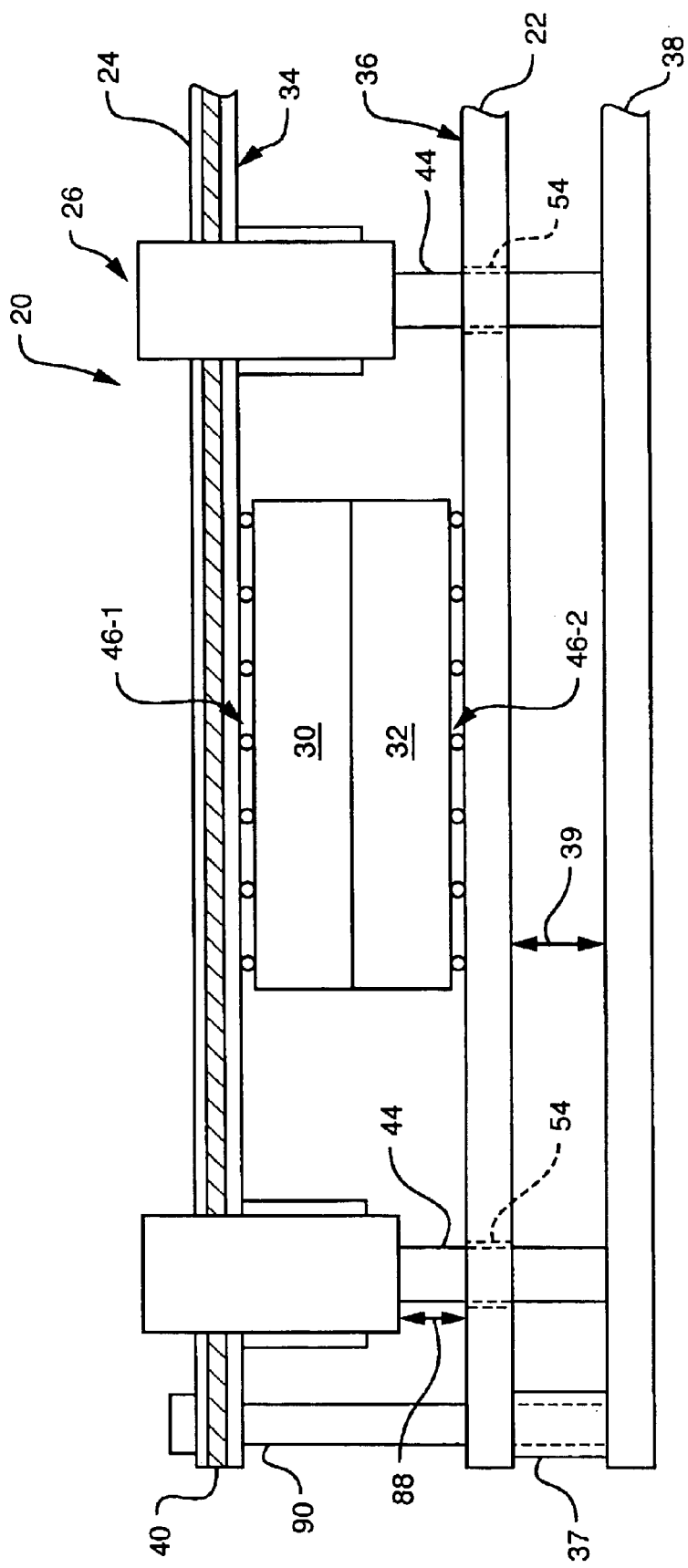
FIG. 2 illustrates a side view of the motherboard assembly of FIG. 1, according to one embodiment of the invention.

FIGS. 1 and 2 illustrate a motherboard assembly 20 suitable for use of embodiments of the invention. The motherboard assembly 20 includes a motherboard 22, a circuit board 24 (e.g., daughter board), and an ejector assembly 26. The circuit board 24 and the ejector assembly 26 collectively form a circuit board assembly 28.

The circuit board 24 is formed from circuit board materials (e.g., fiberglass, copper, etc.) and circuit board components (e.g., integrated circuits (ICs), resistors, inductors, and transceivers) mounted to the circuit board 24. The circuit board 24 defines a planar surface 34 where the circuit board 24 has one or more circuit board connectors 30 coupled to the planar surface 34. The circuit board connectors 30 provide a relatively high-density connection between the circuit board 24 and the motherboard 22. For example, each circuit board connector 30 of the circuit board 24 has between 200 and 300 contacts or connection pins that allow transfer of data, power, and ground signals between the circuit board 30 and the motherboard 22. The circuit board 24, in one arrangement, has several circuit board connectors 30. In certain arrangements, therefore, the total number of contacts or pins associated with the circuit board 24 is greater than 1000 connection pins.

In one arrangement, as illustrated in FIG. 2, the circuit board connector 30 is a surface mount connector. For example, the circuit board connector 30 attaches to the motherboard 22 using a solder ball or solder column array 46-1. The solder ball array 46-1 forms a solder joint between the circuit board connector 30 and the circuit board 24 that provides mechanical attachment of the circuit board connector 30 to the circuit board 24 and provides electrical communication between the circuit board connector 30 and the circuit board 24.

As shown in FIGS. 1 and 2, the ejector assembly 26 couples to the planar surface 34 of the circuit board 24. For example, fasteners 42 mechanically couple the ejector assembly 26 to the circuit board 24. The circuit board 24 also defines a ground plane 40, as illustrated in FIG. 2. The ground plane is a generally contiguous signal layer that carries a power supply ground signal (e.g., a reference voltage such as zero volts or chassis ground) from an external power supply to the circuit board circuitry. In one arrangement, the fasteners 42 couple the ejector assembly 26 to the ground plane 40 of the circuit board 24. For example, the circuit board 24 defines plated through holes 52 in electrical communication with the ground plane 40. As the fasteners 42 (e.g., electrically conductive fasteners 42) couple to both the ejector assembly 26 and the plated through holes 52, such coupling provides electrical communication between the ejector assembly 26 and the ground plane 40, thereby aiding in shielding the circuit board 24 from electromagnetic interference (EMI) radiation.

The motherboard 22 is formed from circuit board materials (e.g., fiberglass, copper, etc.) and circuit board components (e.g., integrated circuits (ICs), resistors, inductors, and transceivers) mounted to the motherboard 22. The motherboard 22 defines a planar surface 36 where the motherboard 22 has one or more motherboard connectors 32, corresponding to the circuit board connectors 30, coupled to the planar surface 36. The motherboard connectors 32 provide a relatively high-density connection between the motherboard 22 and the circuit board 24. For example, each motherboard connector 32 of the motherboard 22 has between 200 and 300 contacts or connection sockets that allow transfer of data, power, and ground signals between the motherboard 22 and the circuit board 24. The motherboard 22, in one arrangement, has several motherboard connectors 32. In certain arrangements, therefore, the total number of contacts or sockets associated with the motherboard 22 is greater than 1000 contacts or sockets.

As illustrated in FIGS. 1 and 2, the planar surface 36 of the motherboard 22 orients substantially parallel to the planar surface 34 of the circuit board 24. Such an arrangement, allows coupling of the circuit board connector 30 to the motherboard connector 32 such that the circuit board 24 and the motherboard 22 orient in a mezzanine-style or parallel board assembly.

In one arrangement, as illustrated in FIG. 2, the motherboard connector 32 is a surface mount connector. For example, the motherboard connector 32 attaches to the motherboard 22 using a solder ball or solder column array 46-2. The solder ball array 46-2 forms a solder joint between the motherboard connector 32 and the motherboard 22 that provides mechanical attachment of the motherboard connector 32 to the motherboard 22 and provides electrical communication between the motherboard connector 32 and the motherboard 22.

FIG. 2 illustrates the motherboard connector 32 as coupled to the circuit board connector 30. Coupling of the motherboard connector 32 and the circuit board connector 30 generates a connection force (e.g., friction force) between the connectors 30, 32. In one arrangement, such a connection force is greater than approximately 100 pounds force.

Also shown in FIG. 2, the motherboard 22 couples to a support member, or carrier tray 38, via side portions or stand-offs 37. The motherboard 22 and the support member 38 define a space 39 between the motherboard 22 and the support member 38. The support member 38 operates as a carrier for holding the motherboard 22 during connection of the motherboard 22 to a back plane of a computer system. The space 39 between the support member 38 and the motherboard 22 provides proper alignmnent of the motherboard 22 relative to the back plane during assembly of the computer system.

FIG. 2 illustrates motherboard assembly 20 as having a bearing 44. The bearing 44 is configured to contact the ejector assembly 26 via an opening 54 defined by the motherboard 22. For example, when the circuit board connector 38 of the circuit board 24 couples with the motherboard connector 32 of the motherboard 22, the bearing 44 enters an opening 54 defined by the motherboard 22 and contacts a lever 64 of the ejector assembly 26 (e.g., the lever 64 illustrated in FIG. 3). Such contact biases the lever 64 against the circuit board 24 (e.g., against the planar surface 34 defined by the circuit board 24) thereby positioning the lever 64, relative to the circuit board 24 and motherboard 22, to allow disengagement of the circuit board connector 30 from the motherboard connector 32.

The motherboard assembly 20 uses motherboard mounting fasteners 90 to secure the circuit board 24 to the motherboard 22. For example, the support member 38 has associated stand-offs 37 coupled to the support member 38. The user first mounts the motherboard 22 to the support member using either male-female or male-male adaptors.

The user secures an adaptor in a corresponding stand-offs 37. The user inserts male studs of the adaptors within corresponding mounting openings 58 defined by the motherboard. As the user couples the circuit board connector 30 with the motherboard connector 32, the user aligns the mounting openings 56 of the circuit board 24 with the threaded studs of the adaptors protruding through the openings 58 of the motherboard 22. After the user couples the circuit board connector 30 with the motherboard connector 32, the user secures the motherboard mounting fasteners 90 to the threaded studs of the adaptors to secure the circuit board 24 to the motherboard 22 and to maintain electrical communication the circuit board connector 30 and the motherboard connector 32.

Figure 3:
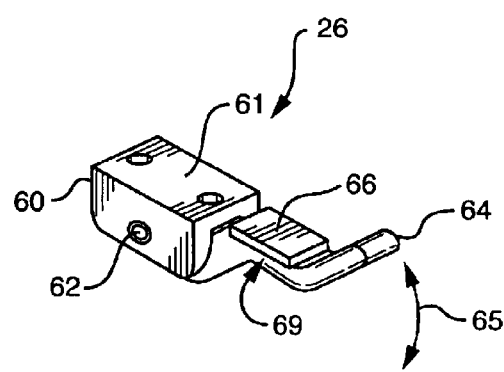
FIG. 3 illustrates a perspective view of an ejector assembly of FIG. 1, according to one embodiment of the invention.

FIG. 3 illustrates an arrangement of the ejector assembly 26 shown in FIGS. 1 and 2. The ejector assembly 26 includes a housing 60, a lever support 62, and a lever 64.

The housing 60, in one arrangement, is configured to house and allow rotation of the lever 64 relative to the circuit board 24 and the motherboard 22. In one arrangement, the housing 60 is configured to secure to the circuit board 24. For example, as illustrated in FIG. 1, the housing 60 of the ejector assembly 26 couples to the circuit board 24 via fasteners 42.

The housing 60 is formed, for example, from an electrically conductive material, such as a metal material. In such an arrangement, the fasteners 42 secure the housing 60 to the plated through holes 52, defined by the circuit board 24, thereby coupling the housing 60 to the ground plane 40 of the circuit board 24. In another arrangement, the planar surface 34 the circuit board 24 defines a conductive pad located in proximity to the plated through holes 52 (e.g., in proximity to the location where the housing 60 couples to the circuit board 24) where the conductive pad electrically communicates (e.g., electrically couples) with the ground plane 40 of the circuit board 24. In such an arrangement, when the fasteners 42 fasten the housing 60 of the ejector assembly 26 to the planar surface 34 of the circuit board 24, thereby electrically coupling the ejector assembly 26 to the ground plane 40 of the circuit board 24.

Returning to FIG. 3, the lever support 62 couples to the housing 60 and secures the lever 64 within the housing 60. In one arrangement, the lever support 62 is formed of an electrically conductive material and allows electrical coupling (e.g., grounding) of the lever support 62 with the ground plane 40 of the circuit board 24, via the housing 60.

Figure 4:
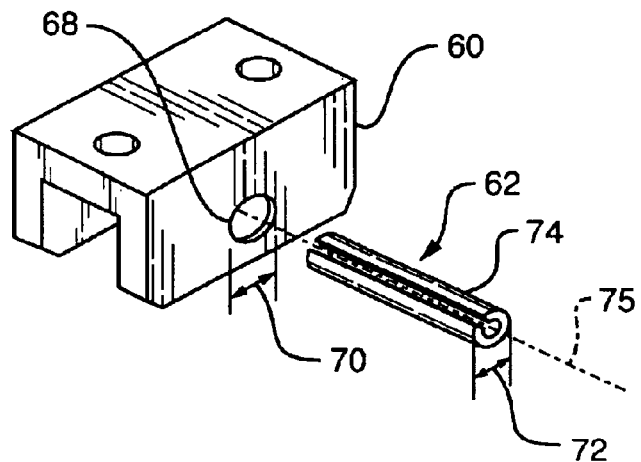
FIG. 4 illustrates a perspective view of a housing of the ejector assembly of FIG. 1, according to one embodiment of the invention.
Figure 5:
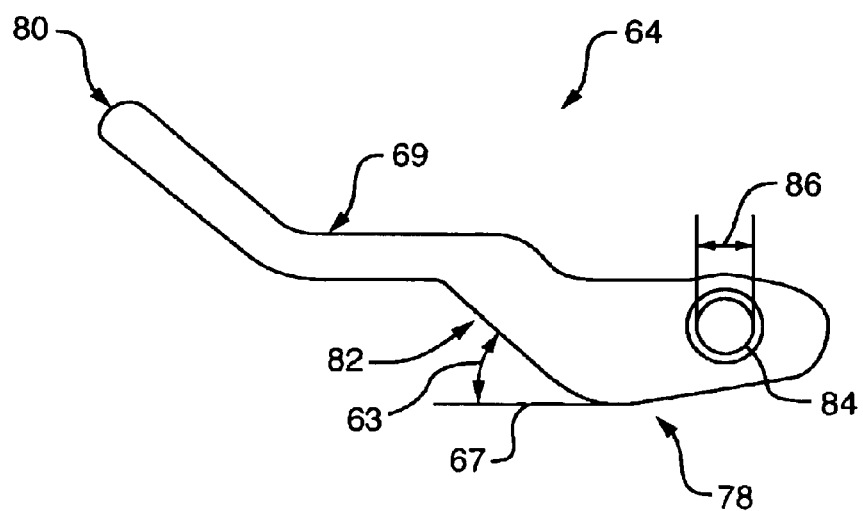
FIG. 5 illustrates a side view of a lever of the ejector assembly of FIG. 1, according to one embodiment of the invention.

FIG. 4 illustrates an arrangement of the lever support 62. As illustrated, the lever support is configured as a split-shaft pin 74 and formed of a spring steel material. Such a configuration creates a friction fit between the lever support 62 and the housing 60 and minimizes disengagement of the lever 64 from the housing 60. For example, during manufacture of the ejector assembly 26, an assembler inserts the lever 64 within the housing 60 and aligns an opening 84 defined by the lever 64, as illustrated in FIG. 5, with openings 68 defined by the housing 60. Returning to FIG. 4, the assembler compresses a diameter 72 of the split-shaft pin 74, relative to a long axis 75 of the pin 74, and inserts the pin 74 within the openings 68 defined by the housing 60 and within the opening 84 defined by the lever 64. As the assembler decompresses the diameter 72 of the split shaft pin 74, the diameter of the pin 74 expands relative to the long axis 75 such that the pin 74 engages the openings 68 defined by the housing 60 to create a friction fit between the openings 68 defined by the housing and split shaft pin 74.

Returning to FIG. 3, the lever 64 is configured to cause the ejector assembly 26 to disengage the circuit board connector 30 of the circuit board 24 from the motherboard connector 32 of the motherboard 22. The lever rotatably couples to the housing 60 at the lever support 62. Such coupling allows the lever to rotate 65 relative to the housing 60 of the ejector assembly 26 to aid in separating the connectors 30, 32 of the respective boards 24, 22.

FIG. 5 illustrates a side view of the lever 64, in one arrangement. The lever 64 has a distal end 78, a proximal end 80, and a bearing contact surface 82 disposed between the distal end 78 and the proximal end 80 of the lever 64.

The distal end 78 of the lever 64 defines the lever opening 84 having a lever opening diameter 86. The diameter 86 of the lever opening 84 is greater than the diameter 70 of the openings 68 defined by the housing 60 and greater than the diameter 72 of the lever support 62 mounted within the housing 60. For example, in one arrangement, the diameter 70 of the housing openings 68 is approximately 0.1285 inches, the outer diameter 72 of the lever support 62 is approximately 0.1285 inches, and the diameter 86 of the lever opening 84 is approximately 0.1440 inches. With the diameter 86 of the lever 64 being greater than diameter 70 of the openings of the housing 60 (e.g., and therefore been greater than the outer diameter 72 of the lever support 62) the lever 64 rotates 65 about the lever support 62, relative to the housing 60, during operation of the ejector assembly.

The bearing contact surface 82 of the lever 64 defines an angle 63 relative to a horizontal reference 67 (e.g., such as the planar surface 36 of the motherboard 22. The angle 63 defined by the bearing contact surface 82 of the lever 64 is configured to allow the bearing contact surface 82 (e.g., including a radiused surface depicted in conjunction with the bearing contact surface) to contact the bearing 44, during operation, and generate a load on the bearing 44 to allow disengagement the circuit board connector 30 from the motherboard connector 32. An arrangement of the operation of the bearing contact surface 82 of the ejector assembly 26 is described with respect to FIG. 6.

Returning to FIG. 3, the ejector assembly 26, in one arrangement, includes a gasket 66 coupled to the lever 64 of the ejector assembly 26. In one arrangement, the gasket 66 is formed of a compressible material orients on a circuit board contact surface 69 of the lever 64. As described above, when the circuit board connector 30 of the circuit board 24 couples with the motherboard connector 32 of the motherboard 22, the bearing 44 biases the lever 64 against the circuit board 24. In the case where the gasket 66 orients between the circuit board contact surface 69 of the lever 64 and the planar surface 34 of the circuit board 24, the bearing 44 compresses the gasket 66 between the lever 64 and the planar surface 34 of the circuit board 24. Such compression of the gasket 66 minimizes the presence of an air gap or space between the lever 64 and the circuit board 24. The gasket 66, therefore, maintains contact between the lever 64 and the circuit board 24 to limit "rattling" of the lever 64 against the circuit board 24 during movement of the circuit board assembly 28, such as experienced during shipping of the circuit board assembly 28 or exposure of the circuit board assembly 28 to a vibrational environment (e.g., the operation of a fan assembly in the vicinity of the circuit board assembly 28).

In one arrangement, the gasket 66 is formed from an electrically conductive material. In such an arrangement, the gasket 66 is configured to electrically couple with the ground plane 40 of the circuit board 24. For example, as described above, the planar surface 34 the circuit board 24 defines a conductive pad located in proximity to the plated through holes 52 (e.g., in proximity to the location where the housing 60 of the ejector assembly 26 couples to the circuit board 24). The conductive pad electrically communicates with the ground plane 40 of the circuit board 24. During assembly, when the bearing 44 compresses the gasket 66 between the lever 64 and the planar surface 34 of the circuit board 24, the gasket 66 contacts the conductive pad of the circuit board 24.

Such contact provides electrical communication between the gasket 66 and the ground plane 40 of the circuit board 24, thereby aiding in shielding the circuit board 24 from EMI radiation.

Figure 6:
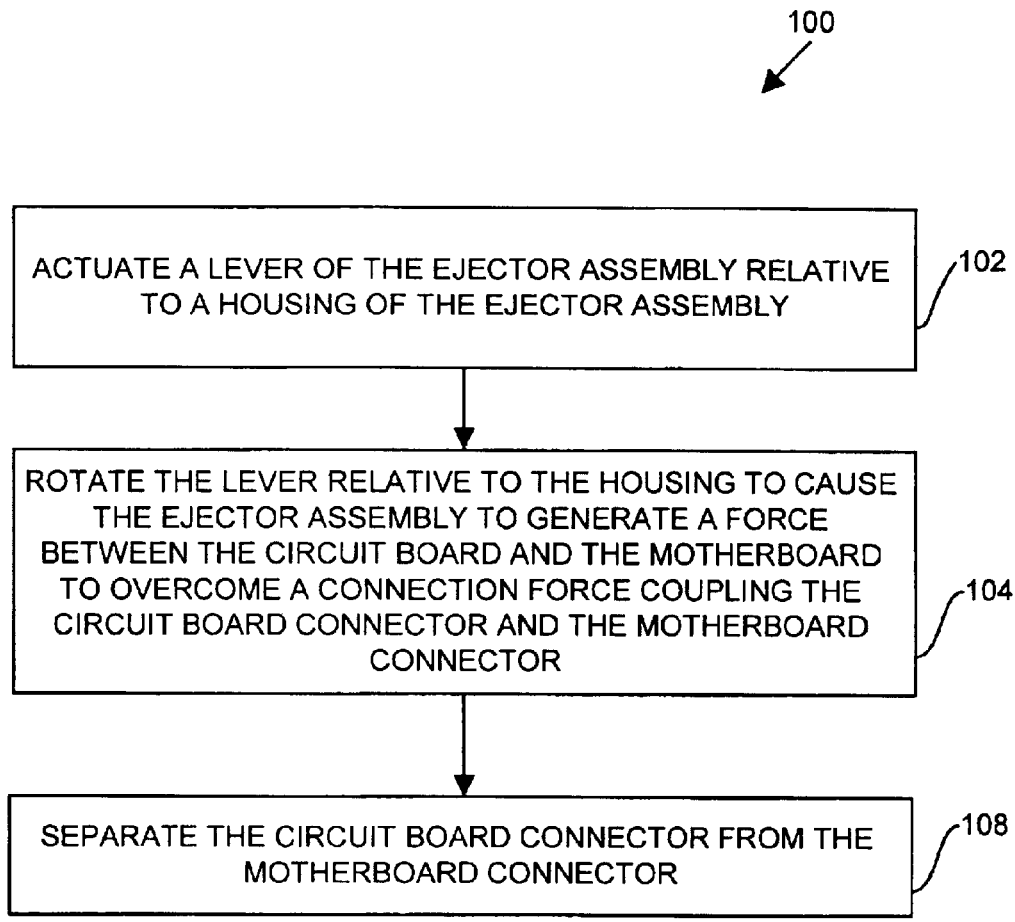
FIG. 6 illustrates a flowchart of procedure for manufacturing an air stream distribution apparatus, according to one embodiment of the invention.
Figure 7:
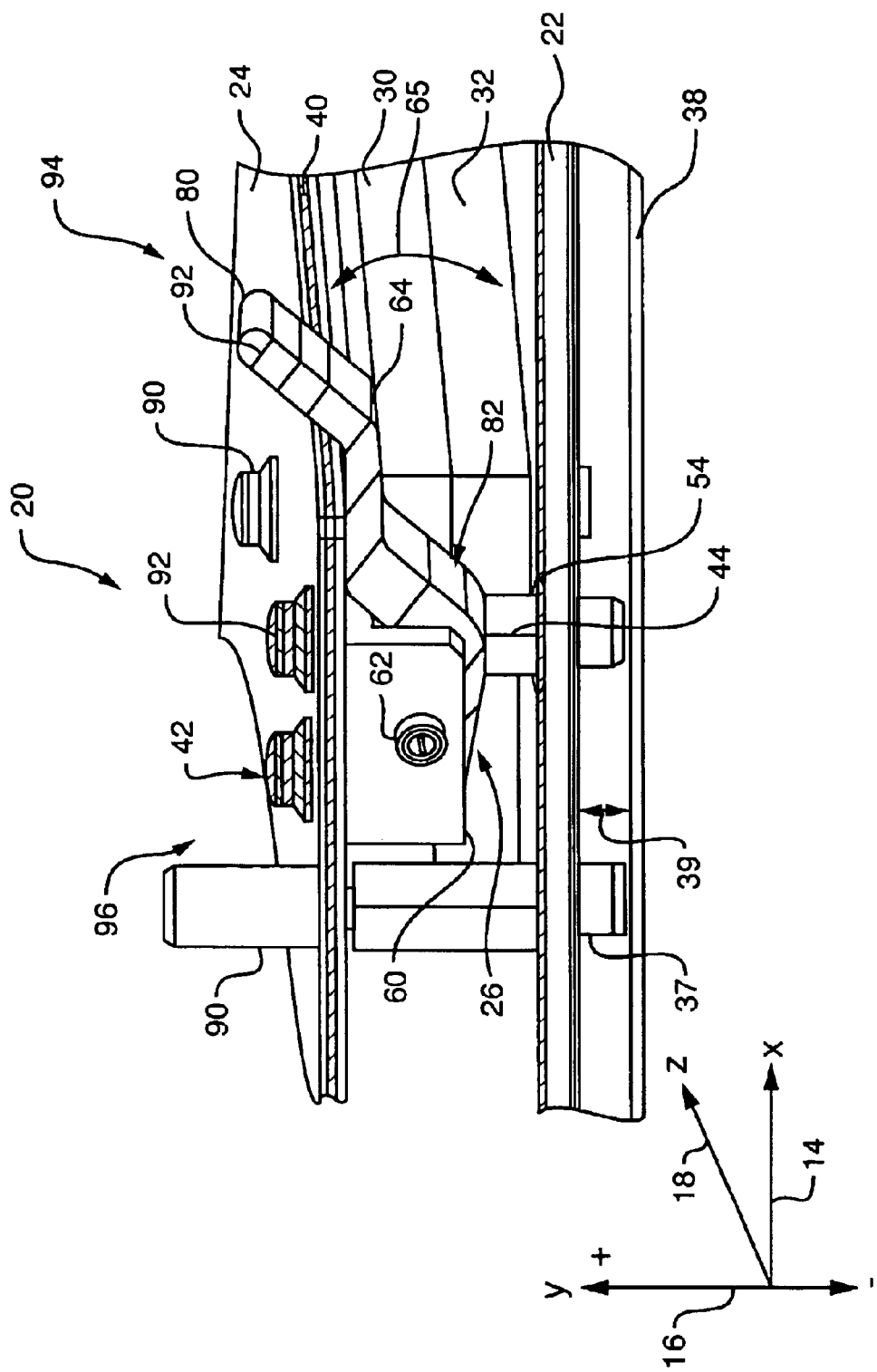
FIG. 7 illustrates a perspective view of the motherboard assembly of FIG. 1, according to one embodiment of the invention.

FIG. 6, taken in conjunction with FIG. 7, illustrates a method 100 for using an ejector assembly 26 to disengage the circuit board connector 30 of a circuit board 24 coupled to a motherboard connector 32 of a motherboard 22 where the planar surface 34 of the circuit board 24 orients substantially parallel to the planar surface 36 of the motherboard 22. Such a method can be performed either manually (e.g., by a technician) or automatically (e.g., by automated equipment).

In step 102, a technician actuates the lever 64 of the ejector assembly 26 relative to the housing 60 of the ejector assembly 26. For example, the technician places a load or a force on the proximal end 80 of the lever 64, such as caused by depressing the proximal end 80 of the lever 64 relative to the circuit board 24. Such a load causes the lever 64 to rotate about the lever support 62.

In step 104, the technician rotates the lever 64 relative to the housing 60 to cause the ejector assembly 26 to generate a force between the circuit board 24 and the motherboard 22 to overcome a connection force coupling the circuit board connector 30 and the motherboard connector 32.

In one arrangement, as the technician rotates the lever 64 relative to the housing 60, the ejector assembly 26 generates a cantilever or rotational force on the circuit board 24, relative to the motherboard 22, to decouple the circuit board connector 30 and the motherboard connector 32. For example, as the lever 64 rotates about the lever support 62, the bearing contact surface 82 of the lever 64 engages the bearing 44 (e.g., the bearing contact surface 82 slideably contacts the bearing 44). As the bearing contact surface 82 contacts the bearing 44, the bearing 44 receives at least a portion of the load placed on the proximal end 80 of the lever 64 by the technician. For example, in the case where the technician depresses the lever 64 relative to the circuit board 24 (e.g., generates a force in the negative y-axis 16 direction), the bearing contact surface 82 generates a load on the bearing 44 in the negative y-axis 16 direction. In turn, as the bearing contact surface 82 of the lever 64 engages the bearing 44, such engagement causes the distal end 78 of the lever 64 (e.g., a portion of an inner surface of the opening 78 defined by the lever 64) to generate a load on the lever support 62 along the positive y-axis 16 direction. The load generated by the lever 64 on the bearing 44 and the corresponding load generated by the lever 64 on the lever support 62 cause the ejector assembly 26 to generate a cantilever or rotational force on the circuit board 24.

The cantilever force from the ejector assembly 26 causes rotation of the circuit board 24 along an x-axis 14 and relative to the motherboard 22 from a front or first portion 94 of the motherboard assembly 20 to a rear or second portion 96 of the motherboard assembly 20. The cantilever force also, in turn, causes the circuit board connector 30 to rotate relative to the motherboard connector 32. In such an arrangement, the cantilever force separates the individual contacts (e.g., pins and sockets) between the circuit board connector 30 and the motherboard connector 32 in a "rolling" fashion (e.g., the cantilever force separates the circuit board connector 30 and the motherboard connector 32 contacts located in proximity to the front portion 94 of the motherboard assembly 20 prior to separating the contacts located in proximity to the rear portion 96 of the motherboard assembly 20). When the technician depresses the lever 64, therefore, the cantilever force generated by the ejector assembly 26 on the lever support 62 is greater than (e.g., overcomes) the connection force (e.g., between pins and sockets associated with the circuit board connector 30 and the motherboard connector 32) that couples the circuit board connector 30 with the motherboard connector 32.

In step 107, the technician separates the circuit board connector 30 from the motherboard connector 32. Separation of the connectors 30, 32, and therefore the boards 22, 24, allows the technician to either rework the motherboard 22 or the circuit board 24 (e.g., upgrade circuit board components) or replace the circuit board 24 with an upgraded circuit board.

The ejector assembly 26 provides a mechanical advantage to a user or technician when separating a circuit board 24 and motherboard 22, connected via circuit board connectors 30, 32 where the circuit board 24 and motherboard 22 couple in a mezzanine or parallel arrangement. For example, as indicated above, coupling of the motherboard connector 32 and the circuit board connector 30 generates a connection force between the connectors 30, 32 greater than approximately 100 pounds force. Without a mechanical advantage, manual separation of the circuit board 24 from the motherboard 22, because of the forces required to separate the motherboard connector 32 and the circuit board connector 30, can be difficult for a person of average strength. The ejector assembly 26 allows the user to separate the motherboard connector 32 and the circuit board connector 30 while minimizing physical exertion of the user.

Furthermore, manual separation of the motherboard connector 32 and the circuit board connector 30 requires a "rocking" motion about either an x-axis 14 or a z-axis 18 relative to the motherboard 22 or circuit board 24, respectively. Such "rocking" motion allows the user to bend the circuit board 24 (e.g., the planar surface 34 defined by the circuit board 24) relative to a plane defined by the x-axis 14 and the z-axis 18. Furthermore, the "rocking" motion allows the user to bend the motherboard 22 (e.g., the planar surface 36 defined by the motherboard 22) relative to a plane defined by the x-axis 14 and the z-axis 18. In turn, such bending of either the circuit board 24 or the motherboard 22 can potentially damage electrical traces or components carried by the boards 24, 22 and lead to malfunctioning of the boards 24, 22. The use of the ejector assembly 26 minimizes bending of either the circuit board 24 or the motherboard 22, relative to the plane defined by the x-axis 14 and the z-axis 18 during separation of the motherboard connector 32 and the circuit board connector 30 and therefore minimizes damage to the electrical traces or components carried by the boards 24, 22 during the separation process.

FIG. 7, as indicated above, illustrates the use of a bearing 44 to assist in disengagement of the circuit board connector 30 from the motherboard connector 32. As described, as the lever 64 of the ejector assembly 26 rotates about the lever support 62, the bearing contact surface 82 of the lever 64 engages the bearing 44 such that the bearing 44 receives at least a portion of the load placed on the proximal end 80 of the lever 64 by the technician. In one arrangement, the bearing 44 couples to the support member 38 to direct the load received from the lever 64 toward the support member 38. By directing the load from the lever 64 toward the support member 38, the bearing 44 minimizes loading of the motherboard 22 by the lever 64 and, therefore, minimizes damage or failure of the motherboard 22 or motherboard components 31 as caused by the loading.

For example, as indicated above, the motherboard 22 includes a surface mount motherboard connector 32 that attaches to the motherboard 22 using a solder ball or solder column array 46-2. When a user applies relatively large stresses to the surface 36 of the motherboard 22, such as the stresses that occur during extraction or separation of the circuit board connector 30 from the motherboard connector 32, the motherboard 22 transfers the stresses to the solder ball array 46-2, such as a solder ball array 46 located in proximity to the source of the stress (e.g., the lever 64). Such stresses, in turn, can lead to fracture of the solder balls (e.g., solder joints) forming the solder ball array 46-2 and, therefore, malfunctioning of the corresponding motherboard connector 32. In the case where the bearing 44 transfers the load received from the lever 64 during separation of the circuit board connector 30 from the motherboard connector 32, the bearing 44 minimizes the potential for the load to fracture the solder ball array 46-2 associated with the motherboard connector 32.

FIG. 7 also illustrates the fasteners 42 that mechanically couple the ejector assembly 26 to the circuit board 24 and the lever 64 of the ejector assembly 26 as having a common visual grouping characteristic 92 distinct from a visual characteristic of the motherboard mounting fasteners 90 associated with the circuit board 24. For example, in one arrangement, the fasteners 42 and the lever 64 of the ejector assembly 26 include, as a visual grouping characteristic 92, a black coating, such as a black zinc plating, and the motherboard mounting fasteners 90 have a clear zinc plating. Such a common visual grouping characteristic 92 is distinct from the coloring (e.g., visual characteristic) of the motherboard mounting fasteners 90 (e.g., where). The common visual grouping characteristic 92 allows a user to distinguish or differentiate the fasteners 42 that couple the ejector assembly 26 to the circuit board 24 from the fasteners 90 that couple the circuit board 24 to the motherboard 22. Such differentiation allows the user to remove the motherboard mounting fasteners 90 coupling the circuit board 24 to the motherboard 22 to decouple the circuit board 24 from the motherboard 22 (e.g., prior to actuating the lever 64 to disengage the circuit board 24 from the motherboard 22), rather than inadvertently removing the fasteners 42 that secure the ejector assembly 26 to the circuit board 24 and detaching the ejector assembly 26 from the circuit board 24.

Figure 8:
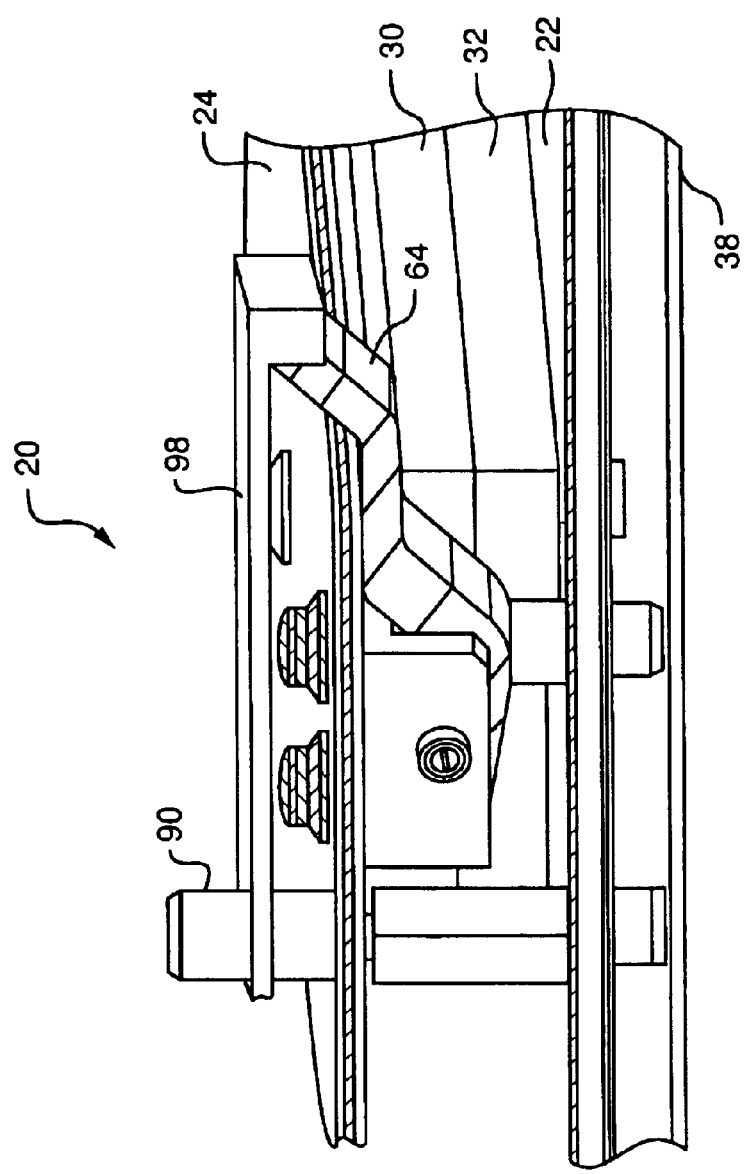
FIG. 8 illustrates a perspective view of the motherboard assembly of FIG. 1, according to another embodiment of the invention.

FIG. 8 illustrates an arrangement of the motherboard assembly 20 where the circuit board 24 has an interlock 98 coupled to the circuit board 24 via motherboard mounting fasteners 90. As shown, the interlock 98 covers a portion of the lever 64 of ejector assembly 26. In order for a user to gain access to the lever 64 of the ejector assembly 26 (e.g., to actuate the lever 64 during an ejection procedure), the user removes the motherboard mounting fasteners 90 that secure the circuit board 24 to the motherboard 22, thereby decoupling the circuit board 24 from the motherboard 22. The user then removes the interlock 98 from the lever 64 of the ejector assembly 26 to gain access to the lever 64 and, therefore, utilize the ejector assembly 26 to separate the circuit board connector 30 from the motherboard connector 32. The interlock 98, therefore, ensures that, prior to a user utilizing the ejector assembly 26 to separate the circuit board connector 30 from the motherboard connector 32, the user mechanically decouples the circuit board 24 from the motherboard 22. By limiting the ability of the user to actuate the lever 64 without first decoupling the circuit board 24 from the motherboard 22, the interlock 98 minimizes the potential for the user to damage the circuit board 24, the motherboard 22, or the ejector assembly 26 (e.g., damage caused by the user placing a load on the lever 64 sufficient to separate the circuit board connector 30 from the motherboard connector 32 when the motherboard mounting fasteners 90 secure the circuit board 24 to the motherboard 22).

While this invention has been particularly shown and described with references to preferred embodiments thereof, it will be understood by those skilled in the art that various changes in form and details may be made therein without departing from the spirit and scope of the invention as defined by the appended claims.

For example, as indicated above, the motherboard assembly 20 has a bearing 44 configured to contact the lever 64 of the ejector assembly 26 to bias the lever 64 against the circuit board 24 and position the lever 64, relative to the circuit board 24 and motherboard 22, to allow disengagement of the circuit board connector 30 from the motherboard connector 32. In one arrangement, as shown in FIG. 2, the bearing 44 defines an adjustable bearing height 88 relative to the planar surface 36 of the motherboard 22. For example, when a user couple the circuit board connector 30 to the motherboard connector 32, the bearing 44 enters an opening 54 defined by the motherboard 22 and is configured to contact the lever 64 of the ejector assembly 26. In the case where the bearing 44 does not contact the lever 64 after assembly of the motherboard assembly, such as caused by tolerance errors in the hardware (e.g., fasteners 40, connectors 30, 32, etc.) of the motherboard assembly 20, the adjustable bearing height 88 of the bearing 44 allows the user to adjust the height of the bearing 44 such that the bearing contacts the lever 64. For example, in one arrangement, the bearing 44 mates with the support member 38 via a threaded opening defined by the support member 38. A user, therefore, rotates the bearing 44 within the threaded opening defined by the support member 38 to modify the adjustable bearing height 88 of the bearing 44.

Also as described above, the ejector assembly 26 allows separation of the circuit board connector 30 from the motherboard connector 22 while minimizing bending of either the circuit board 24 or the motherboard 22 relative to the plane defined by the x-axis 14 and the z-axis 18. The ejector assembly 26, therefore, minimizes damage to the electrical traces or components carried by the boards 24, 22 during the separation process. In one arrangement, as shown in FIG. 1, the circuit board 24 has one or more stiffening elements 50 oriented on an edge 50 defined by the circuit board 24. For example, in one arrangement, the stiffening elements 50 are fommed of a relatively rigid material (e.g., fiberglass, aluminum, etc.) coupled to the circuit board 24. During an ejection process (e.g., separation of the circuit board connector 30 from the motherboard connector 32), the stiffening elements 50 minimize bending of the circuit board 24 relative to the plane defined by the x-axis 14 and the z-axis 18 and, therefore, minimizes damage to electrical traces or components carried by the boards 24, 22 during the ejection process. While the stiffening elements are illustrated as oriented along the x-axis direction 14 of the edge 50 defined by the circuit board 24, such illustration is by way of example only. A manufacturer can orient additional stiffening elements 50 along the z-axis direction 18 of the edge 50 defined by the circuit board 24.

As indicated above, and as illustrated in FIGS. 1, 2, 7 and 8, in one arrangement of the motherboard assembly 20 the ejector assembly 26 couples to the circuit board 24. During operation a user actuates the lever 64 of the ejector assembly 26 and generates a load on the bearing 44 where the bearing 44 is associated with the motherboard 22 (e.g., contacts the lever 64 through an opening 54 defined by the motherboard 22). Such an arrangement is by way of example only. In another arrangement, the ejector assembly 26 couples to the motherboard 22 of the motherboard assembly 20. During operation, the user actuates the lever 64 of the ejector assembly 26 and generates a load on a bearing 44 where the bearing 44 is associated with the circuit board 24.

FIGS. 1 and 2 illustrate the circuit board 24 as having two ejector assemblies 261, 26-2 coupled to the circuit board 24 and oriented on a front edge 47 (e.g., located on the same side) of the circuit board 24. When a user actuates the levers, the ejector assemblies 26-1, 26-2 cause the circuit board 24 to rotate relative to the motherboard 22 (e.g., the ejector assemblies 26-1, 26-2 generate a cantilever force between the circuit board 24 and the motherboard 22), thereby separating the circuit board connector 30 and the motherboard connector 32. Such an arrangement is by way of example only. In another arrangement, the ejector assemblies 26-1, 26-2 couple to the circuit board 24 and orient on opposing edges 48 defined by the circuit board 24 (e.g., a first ejector assembly 26-1 orients on a first edge 48-1 of the circuit board 24 at approximately 180° relative to the second ejector assembly 26-2 oriented on a second edge 48-2 of the circuit board 24. When a user actuates the levers 64 associated with the corresponding ejector assemblies 26-1, 26-2, the ejector assemblies 26-1, 26-2 generate a linear force (e.g., a force generated substantially along the y-axis 16) between the circuit board 24 and the motherboard 22 and cause a linear (e.g., as opposed to rotational) separation of the circuit board connector 30 from the motherboard connector 32 (e.g., separation made substantially along the y-axis 16).

What is claimed is:

1. An ejector assembly comprising:

a housing;

a lever support coupled to the housing; and a lever having a distal end, a proximal end, and a bearing contact surface disposed between the distal end and the proximal end, the distal end of the lever rotatably coupled to the lever support, the lever configured to rotate about the lever support, relative to the housing and in response to an actuation force, and the bearing contact surface configured to slidably contact a bearing to disengage at least one circuit board connector extending from a planar surface defined by a circuit board from at least one motherboard connector extending from a planar surface defined by a motherboard when the at least one circuit board connector couples to the at least one motherboard connector, the planar surface of the circuit board oriented substantially parallel to the planar surface of the motherboard.

2. The ejector assembly of claim 1 wherein the lever comprises a gasket configured to contact the planar surface defined by the circuit board.

3. The ejector assembly of claim 2 wherein the gasket comprises an electrically conductive material, the gasket configured to electrically couple with a ground plane of the circuit board.

4. The ejector assembly of claim 1 wherein the lever support comprises a split-shaft pin formed from a spring steel material.

5. The ejector assembly of claim 1 further comprising a fastener configured to couple the ejector assembly to the first circuit board, the fastener and the lever having a common visual grouping characteristic distinct from a visual characteristic of a motherboard mounting fastener associated with the circuit board.

6. A circuit board assembly comprising:

a circuit board having at least one circuit board connector extending from a planar surface defined by the circuit board, the at least one circuit board connector configured to couple to at least one motherboard connector of a motherboard, the planar surface of the circuit board configured to orient substantially parallel to a planar surface of the motherboard; and an ejector assembly having:

a housing coupled to the planar surface defined by the circuit board, a lever support coupled to the housing, and a lever having a distal end, a proximal end, and a bearing contact surface disposed between the distal end and the proximal end, the distal end of the lever rotatably coupled to the lever support, the lever configured to rotate about the lever support, relative to the housing and in response to an actuation force, and the bearing contact surface configured to slidably contact a bearing to disengage the at least one circuit board connector from the at least one motherboard connector when the at least one circuit board connector couples to the at least one motherboard connector.

7. The circuit board assembly of claim 6, wherein the lever comprises a gasket configured to contact the planar surface defined by the circuit board.

8. The circuit board assembly of claim 7 wherein the gasket comprises an electrically conductive material, the gasket configured to electrically couple with a ground plane of the circuit board.

9. The circuit board assembly of claim 6 wherein the lever support comprises a split-shaft pin formed from a spring steel material.

10. The circuit board assembly of claim 6 wherein the ejector assembly comprises a fastener coupling the ejector assembly to the circuit board, the fastener and the lever having a common visual grouping characteristic distinct from a visual characteristic of a motherboard mounting fastener associated with the circuit board.

11. The circuit board assembly of claim 6 wherein the circuit board defines an edge, the edge comprising a stiffening element.

12. The circuit board assembly of claim 6 wherein the at least one circuit board connector comprises a surface mount connector.

13. The circuit board assembly of claim 6 wherein the circuit board comprises an interlock coupled to the circuit board via motherboard mounting fasteners, the interlock covering a portion of the lever of ejector assembly.

14. A motherboard assembly comprising:
a motherboard having at least one motherboard connector extending from a planar surface defined by the motherboard;
a circuit board having at least one circuit board connector extending from a planar surface defined by the circuit board; the at least one circuit board connector coupled to the at least one motherboard connector of a motherboard, the planar surface of the circuit board oriented substantially parallel to the planar surface of the motherboard; and
an ejector assembly oriented between the motherboard and the circuit board, the ejector assembly having:
a housing coupled to the planar surface defined by the circuit board,
a lever support coupled to the housing, and
a lever having a distal end, a proximal end, and a bearing contact surface disposed between the distal end and the proximal end, the distal end of the lever rotatably coupled to the lever support, the lever configured to rotate about the lever support, relative to the housing and in response to an actuation force, and the bearing contact surface configured to slidably contact a bearing to disengage the at least one circuit board connector from the at least one motherboard connector when the at least one circuit board connector couples to the at least one motherboard connector.

15. The motherboard assembly of claim 14 further comprising a support member coupled to the motherboard, the support member and the motherboard defining a space between the support member and the motherboard, the bearing coupled to the support member and oriented within an opening defined by the motherboard.

16. The motherboard assembly of claim 15 wherein the bearing defines an adjustable bearing height relative to the planar surface of the motherboard.

17. The motherboard assembly of claim 14 wherein the lever comprises a gasket configured to contact the planar surface defined by the circuit board.

18. The motherboard assembly of claim 17 wherein the gasket comprises an electrically conductive material, the gasket configured to electrically couple with a ground plane of the circuit board.

19. The motherboard assembly of claim 14 wherein the lever support comprises a split-shaft pin formed from a spring steel material.

20. The motherboard assembly of claim 14 wherein the ejector assembly comprises a fastener coupling the ejector assembly to the circuit board, the fastener and the lever having a common visual grouping characteristic distinct from a visual characteristic of a motherboard mounting fastener associated with the circuit board.

21. The motherboard assembly of claim 14 wherein the circuit board defines an edge, the edge comprising a stiffening element.

22. The motherboard assembly of claim 14 wherein the at least one circuit board connector comprises a surface mount connector.

23. The motherboard assembly of claim 14 wherein the at least one motherboard connector comprises a surface mount connector.

24. The motherboard assembly of claim 14 wherein the circuit board comprises an interlock coupled to the circuit board via motherboard mounting fasteners, the interlock covering a portion of the lever of ejector assembly.

25. A method for using an ejector assembly to disengage a circuit board connector of a circuit board coupled to a motherboard connector of a motherboard, the planar surface of the circuit board oriented substantially parallel to a planar surface of the motherboard, comprising:
actuating a lever of the ejector assembly relative to a housing of the ejector assembly;
rotating the lever relative to the housing to cause the ejector assembly to generate a force between the circuit board and the motherboard to overcome a connection force coupling the circuit board connector and the motherboard connector;
engaging a bearing contact surface of the lever with a bearing; and
separating the circuit board connector from the motherboard connector.

26. The method of claim 25 wherein the step of engaging comprises engaging a bearing contact surface of the lever with a bearing, the bearing coupled to a support member fastened to the motherboard.

27. The method of claim 25 further comprising:
removing motherboard mounting fasteners securing the circuit board to the motherboard to decouple the circuit board from the motherboard; and
removing an interlock coupled to the circuit board via the motherboard mounting fasteners, the interlock covering a portion of the lever of ejector assembly.

28. The method of claim 25 further comprising:
identifying a fastener coupling the ejector assembly to the circuit board via a common visual grouping characteristic associated with the fastener and the lever;
differentiating the fastener coupling the ejector assembly to the circuit board from motherboard mounting fasteners coupling the circuit board to the motherboard based upon the visual grouping characteristic; and
prior to actuating the lever, removing the motherboard mounting fasteners coupling the circuit board to the motherboard to decouple the circuit board from the motherboard.

29. A means for ejecting a circuit board connector of a circuit board from a motherboard connector of a motherboard:
a housing;
a ejector support means coupled to the housing; and
an ejector means having a distal end, a proximal end, and a bearing contact surface disposed between the distal end and the proximal end, the distal end of the ejector means rotatably coupled to the ejector support means, the ejector means configured to cause the bearing contact surface to slidably contact a bearing to cause the means for ejecting to disengage at least one circuit board connector extending from a planar surface defined by a circuit board from at least one motherboard connector extending from a planar surface defined by a motherboard when the at least one circuit board connector couples to the at least one motherboard connector, the planar surface of the circuit board oriented substantially parallel to the planar surface of the motherboard.

30. The circuit board assembly of claim 6 wherein the circuit board further comprises at least one fastener to secure the circuit board to the motherboard.

31. The motherboard assembly of claim 14 wherein the circuit board further comprises at least one fastener to secure the circuit board to the motherboard.

32. The ejector assembly of claim 1 wherein the ejector assembly is configured to electrically couple to a ground plane of the circuit board.

33. The circuit board assembly of claim 6 wherein the ejector assembly is configured to electrically couple to a ground plane of the circuit board.

34. The motherboard assembly of claim 14 wherein the ejector assembly is configured to electrically couple to a ground plane of the circuit board.

35. The ejector assembly of claim 1 wherein the bearing contact surface of the lever defines an angle relative to a horizontal reference.

36. The circuit board assembly of claim 1 wherein the bearing contact surface of the lever defines an angle relative to a horizontal reference.

37. The motherboard assembly of claim 14 wherein the bearing contact surface of the lever defines an angle relative to a horizontal reference.

* * * * *